United States Patent
Kuroki et al.

(10) Patent No.: US 8,710,861 B2
(45) Date of Patent: Apr. 29, 2014

(54) SEMICONDUCTOR DEVICE AND METHOD OF ADJUSTING CHARACTERISTIC THEREOF

(75) Inventors: Koji Kuroki, Tokyo (JP); Daiki Nakashima, Tokyo (JP); Ryuuji Takishita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/137,588

(22) Filed: Aug. 26, 2011

(65) Prior Publication Data

US 2012/0056641 A1 Mar. 8, 2012

(30) Foreign Application Priority Data

Aug. 27, 2010 (JP) ................................. 2010-190271

(51) Int. Cl.
*H03K 17/16* (2006.01)
*H03K 19/003* (2006.01)
*H03B 1/00* (2006.01)
*G11C 7/00* (2006.01)

(52) U.S. Cl.
USPC .......................... 326/30; 327/109; 365/189.11

(58) Field of Classification Search
USPC ............ 326/30; 327/108, 109, 170, 172–176; 365/189.05, 189.11
See application file for complete search history.

(56) References Cited

U.S. PATENT DOCUMENTS

| | | | |
|---|---|---|---|
| 6,762,620 B2 * | 7/2004 | Jang et al. ........................ | 326/30 |
| 6,836,143 B2 * | 12/2004 | Song ................................ | 326/30 |
| 7,038,486 B2 * | 5/2006 | Aoyama et al. .................. | 326/30 |
| 7,164,287 B2 | 1/2007 | Ueno | |
| 7,215,128 B2 * | 5/2007 | Fujisawa ......................... | 324/601 |
| 7,221,193 B1 * | 5/2007 | Wang et al. ..................... | 327/108 |
| 7,362,128 B2 * | 4/2008 | Choi et al. ....................... | 326/30 |
| 7,535,251 B2 | 5/2009 | Morishima et al. | |
| 7,755,366 B2 | 7/2010 | Hosoe et al. | |
| 7,902,858 B2 * | 3/2011 | Kuwahara et al. ............... | 326/30 |
| 7,973,553 B1 * | 7/2011 | Wang et al. ..................... | 326/30 |
| 7,985,150 B2 * | 7/2011 | Kamdem ......................... | 474/94 |
| 7,986,150 B2 | 7/2011 | Yokou | |
| 7,986,161 B2 | 7/2011 | Lee et al. | |
| 7,994,812 B2 * | 8/2011 | Osanai et al. .................... | 326/30 |
| 8,085,061 B2 * | 12/2011 | Kinoshita et al. ............... | 326/30 |
| 2005/0110516 A1 | 5/2005 | Ueno | |
| 2008/0046212 A1 * | 2/2008 | Yoko et al. ...................... | 702/107 |
| 2008/0054981 A1 * | 3/2008 | Hosoe et al. .................... | 327/333 |

(Continued)

FOREIGN PATENT DOCUMENTS

JP 2005-159702 A 6/2005
JP 2008-060629 A 3/2008

(Continued)

*Primary Examiner* — Douglas W Owens
*Assistant Examiner* — Dylan White
(74) *Attorney, Agent, or Firm* — McGinn Intellectual Property Law Group, PLLC

(57) ABSTRACT

To suppress the number of clocks needed to adjust the impedance of an output buffer. A pull-up replica buffer is connected between a calibration terminal and power supply wiring, and is controlled in impedance by a DRZQP signal supplied from a counter. A pull-down replica buffer is connected between ground wiring and a connection node A, and is controlled in impedance by a DRZQN signal supplied from the counter. More specifically, the DRZQP signal and the DRZQN signal indicate count values. The impedances of the replica buffers are increased or decreased stepwise in proportion to the count values. The count values are updated according to a binary search method.

5 Claims, 18 Drawing Sheets

(56) References Cited

U.S. PATENT DOCUMENTS

2008/0068040 A1* 3/2008 Morishima et al. ............. 326/30
2008/0122450 A1   5/2008 Yokou
2010/0007375 A1   1/2010 Lee et al.

FOREIGN PATENT DOCUMENTS

| | | |
|---|---|---|
| JP | 2008-072460 A | 3/2008 |
| JP | 2008-135925 A | 6/2008 |
| JP | 2010-21994 A | 1/2010 |

* cited by examiner

SEMICONDUCTOR DEVICE AND METHOD OF ADJUSTING CHARACTERISTIC THEREOF

BACKGROUND OF THE INVENTION

1. Field of the Invention

The present invention relates to a semiconductor device, and more particularly to a semiconductor device that includes an impedance-adjustable output buffer and a method of adjusting a characteristic of the semiconductor device.

2. Description of Related Art

In recent years, extremely high data transfer rates have been needed for data transfer between semiconductor devices (such as between a CPU and a memory). For implementation, input/output signals have become increasingly smaller in amplitude. Input/output signals of smaller amplitudes make extremely severe the accuracy requirement for the impedances of output buffers.

The impedance of an output buffer not only varies with the process condition during manufacturing, but also is affected by changes in ambient temperature and power supply voltage in actual use. When an output buffer needs a high impedance accuracy, one having an impedance adjustment function is employed. The impedance adjustment to such an output buffer is typically made by using an output impedance adjustment circuit called "calibration circuit."

The calibration circuit includes a replica buffer that has the same configuration as that of the output buffer. In a calibration operation, with an external resistor connected to a calibration terminal, the voltage appearing on the calibration terminal is compared with a reference voltage, and the replica buffer is adjusted accordingly in impedance. The adjustment of the replica buffer is reflected on the output buffer, whereby the impedance of the output buffer is adjusted to a desired value (refer to Japanese Patent Application Laid-Open No. 2010-21994).

The impedance of the replica buffer is adjusted stepwise in synchronization with a clock signal. More specifically, both the voltage comparison of a comparator and the adjustment of the impedance based on the comparison result are performed in synchronization with the clock signal. The higher the frequency of the clock signal, the more difficult it is to secure a time for the comparator to perform the voltage comparison (hereinafter, referred to as "determination time"). Typically, the accuracy of detection of a potential difference by the comparator tends to deteriorate as the determination time decreases.

To address such a problem, a frequency division circuit may be used to reduce the clock signal in frequency so that the impedance can be adjusted in synchronization with the clock signal of reduced frequency. Too low a frequency of the clock signal, however, makes the calibration period long.

SUMMARY

In one embodiment, there is provided a semiconductor device that includes a data output terminal; a first buffer that includes a transistor of a first conductivity type, the transistor being arranged between the data output terminal and a first power supply and being controlled in impedance by a first adjustment code including a plurality of pieces of bit information; a second buffer that includes a transistor of a second conductivity type, the transistor being arranged between the data output terminal and a second power supply and being controlled in impedance by a second adjustment code including a plurality of pieces of bit information; and an output control circuit that generates the first and second adjustment codes based on a binary search method, and outputs the first and second adjustment codes to the first and second buffers, respectively.

In another embodiment, there is provided a semiconductor device that includes a calibration terminal; a first counter that outputs a first adjustment code; a first replica buffer that is connected between the calibration terminal and a first power supply, and is controlled in impedance by the first adjustment code; a first comparator that compares a voltage of the calibration terminal with a first reference voltage; and a counter control circuit that determines a logic level of the first comparator in synchronization with an update clock, and updates the first adjustment code retained in the first counter from higher-order bits based on the result of determination.

In another embodiment, there is provided a method of adjusting a characteristic of a semiconductor device, which includes the steps of changing an impedance of a first replica buffer based on a first adjustment code output from a first counter, the first replica buffer being connected between a calibration terminal and a first power supply; comparing a voltage of the calibration terminal with a first reference voltage; and updating the first adjustment code retained in the first counter based on the result of comparison between the voltage of the calibration terminal and the first reference voltage. When updating the first adjustment code, the first adjustment code retained in the first counter is updated from higher-order bits.

According to the present invention, the number of clocks needed to adjust the impedance of the output buffer can be suppressed easily. This facilitates completing calibration within a prescribed time while securing a determination time for the comparator.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
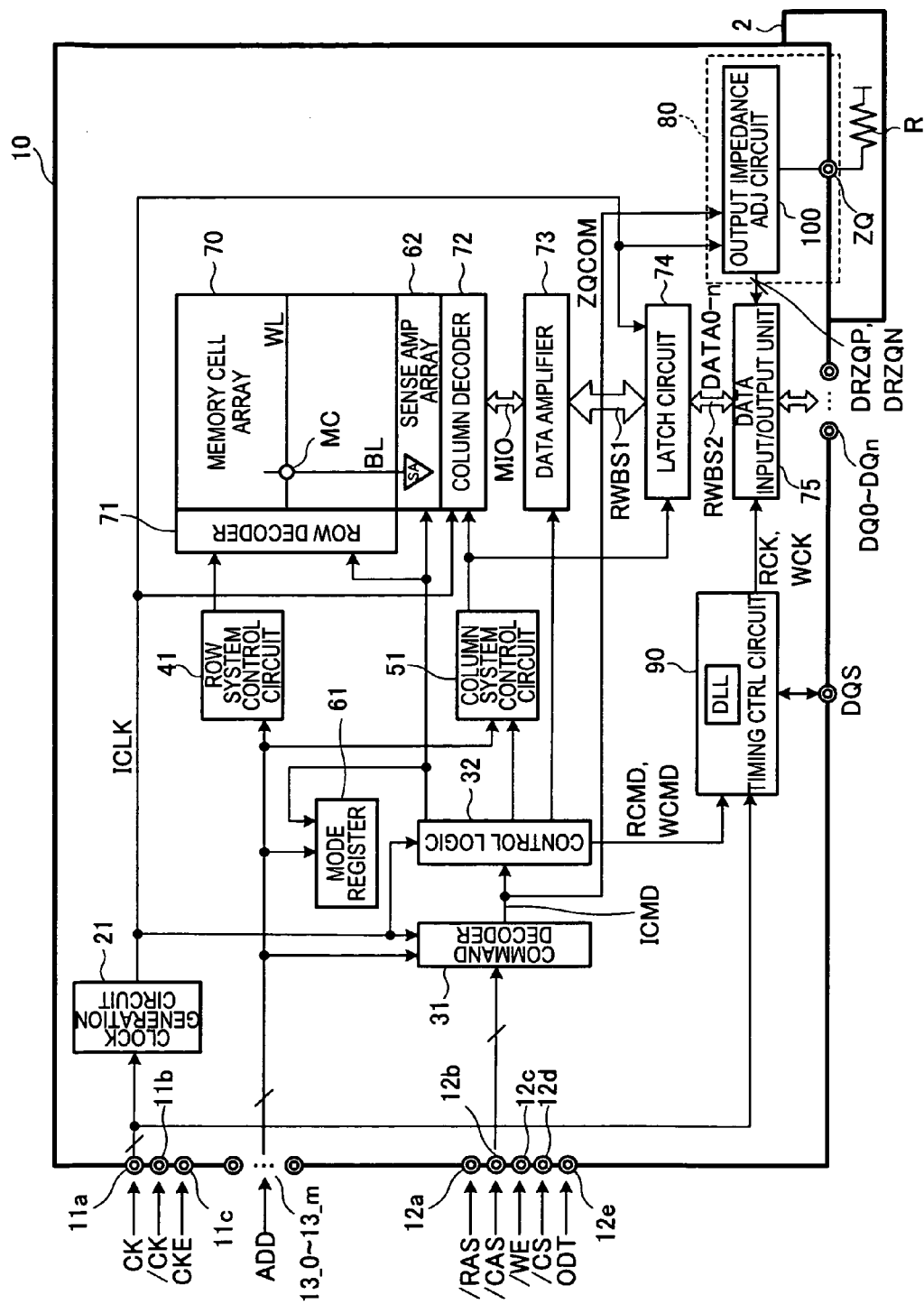
FIG. 1 is a block diagram showing the configuration of a semiconductor device according to a first embodiment.

FIG. 1 is a block diagram showing the configuration of a semiconductor device according to a first embodiment.

As shown in FIG. 1, the semiconductor device 10 according to the present embodiment has external terminals including clock pads 11a and 11b, a clock enable pad 11c, command pads 12a to 12e, address pads 13_0 to 13_m, data pads DQ0 to DQn (data input/output terminals), a data strobe pad DQS, and a calibration pad ZQ (calibration terminal). The semiconductor device 10 also has other pads such as power supply pads, which are omitted from the drawings.

The clock pads 11a and 11b receive external clock signals CK and /CK, respectively. The clock enable pad 11c receives a clock enable signal CKE. The external clock signals CK and /CK and the clock enable signal CKE are supplied to a clock generation circuit 21. As employed herein, a signal having a signal name with a leading "/" is either an inverted signal of the corresponding signal or a low-active signal. The external clock signals CK and /CK are therefore complementary to each other. The clock generation circuit 21 generates an internal clock signal ICLK. The internal clock signal ICLK is supplied to various circuit blocks of the semiconductor device 10.

The command pads 12a to 12e receive a row address strobe signal /RAS, a column address strobe signal /CAS, a write enable signal /WE, a chip select signal /CS, and an on-die termination signal ODT, respectively. Such command signals are supplied to a command decoder 31.

The address pads 13_0 to 13_m receive an address signal ADD. The address signal ADD is supplied to a row system control circuit 41, a column system control circuit 51, the command decoder 31, and a mode register 61 through a not-shown address input circuit. More specifically, the address signal ADD includes a row address and a column address. When in a normal operation mode, the row address is supplied to the row system control circuit 41, and the column address is supplied to the column system control circuit 51. In the case of entering mode register set, the address signal ADD is supplied to the mode register 61, whereby the content of the mode register 61 is updated.

The command decoder 31 is retains, decodes, and/or counts the command signals and part of the address signal in synchronization with the internal clock ICLK to generate various internal commands ICMD. The generated internal commands ICMD are supplied to various circuit blocks of the semiconductor device 10 through control logic 32.

The control logic 32 controls the operation of various circuit blocks in synchronization with the internal clock signal ICLK according to the internal commands ICMD supplied from the command decoder 31 and the output of the mode register 61.

The output of the row system control circuit 41 is supplied to a row decoder 71. The row decoder 71 selects any one of word lines WL included in a memory cell array 70. The memory cell array 70 includes a plurality of word lines WL and a plurality of bit lines BL which cross each other. Memory cells MC are arranged at the intersections (FIG. 1 shows only one of the word lines WL, one of the bit lines BL, and one of the memory cells MC). The bit lines BL are connected to corresponding sense amplifiers SA in a sense amplifier column 62.

The output of the column system control circuit 51 is supplied to a column decoder 72. The column decoder 72 selects any one of the sense amplifiers SA included in the sense amplifier column 62. The sense amplifiers SA selected by the column decoder 72 are connected to a data amplifier 73 through main I/O lines MIO. In a read operation, the data amplifier 73 further amplifies read data that is amplified by the sense amplifiers SA, and supplies the resultant to a latch circuit 74 through a read/write bus RWBS1. In a write operation, the data amplifier 64 amplifies write data that is supplied from the latch circuit 74 through the read/write bus RWBS1, and supplies the resultant to the memory cell array 70.

The latch circuit 74 is a parallel-serial conversion circuit that performs parallel-serial conversion on input/output data between the data amplifier 73 and a data input/output unit 75.

A timing control unit 90 includes a DLL (Delay Locked Loop) circuit which controls the input/output timing of data. In a read operation, the timing control unit 90 outputs a read timing signal RCK, which is intended to control the timing for the data input/output unit 75 to read data, according to a read command RCMD supplied from the control logic 32 and the external clock signals CK and /CK. At the same time, the timing control unit 90 also outputs a data strobe signal to outside through the data strobe pad DQS. In a write operation, the timing control circuit 90 supplies a write timing signal WCK to the data input/output unit 75 according to a write command WCMD supplied from the control logic 32, the external clock signals CK and /CK, and a data strobe signal DQS supplied from outside through the data strobe pad DQS. The write timing signal WCK is intended to control the timing for the data input/output unit 75 to fetch write data.

An output impedance adjustment unit 80 includes an output impedance adjustment circuit 100 (output control circuit) and the calibration terminal ZQ. The output impedance adjustment circuit 100 receives an impedance adjustment command ZQCOM, which is an internal command supplied from the command decoder 31, and the internal clock ICLK supplied from the clock generation circuit 21. The output impedance adjustment circuit 100 then supplies a pull-up impedance adjustment signal DRZQP (first adjustment code) and a pull-down impedance adjustment signal DRZQN (second adjustment code) to the data input/output unit 75. An external resistor R having a desired resistance is connected to the calibration terminal ZQ. The external resistor R is an element that does not belong to the semiconductor device 10, and is mounted on a substrate 2. The substrate 2 is a circuit board on which the semiconductor device 10 is mounted. The output impedance adjustment circuit 100 will be described in detail later.

A read/write bus RWBS2 is composed of a plurality of lines. The data input/output unit 75 outputs a plurality of pieces of read data DATA0 to DATAn supplied from the read/write bus RWBS2 to outside through a respective plurality of data pads DQ0 to DQn (in a read operation). The data input/output unit 75 outputs a plurality of pieces of write data DATA0 to DATAn input through the plurality of data pads DQ0 to DQn to the read/write bus RWBS2 (in a write operation). The data input/output unit 75 will be described in detail later.

The foregoing is the overall configuration of the semiconductor device 10 according to the present embodiment. Next, the configuration of the output impedance adjustment circuit 100 will be described in detail.

Figure 2:
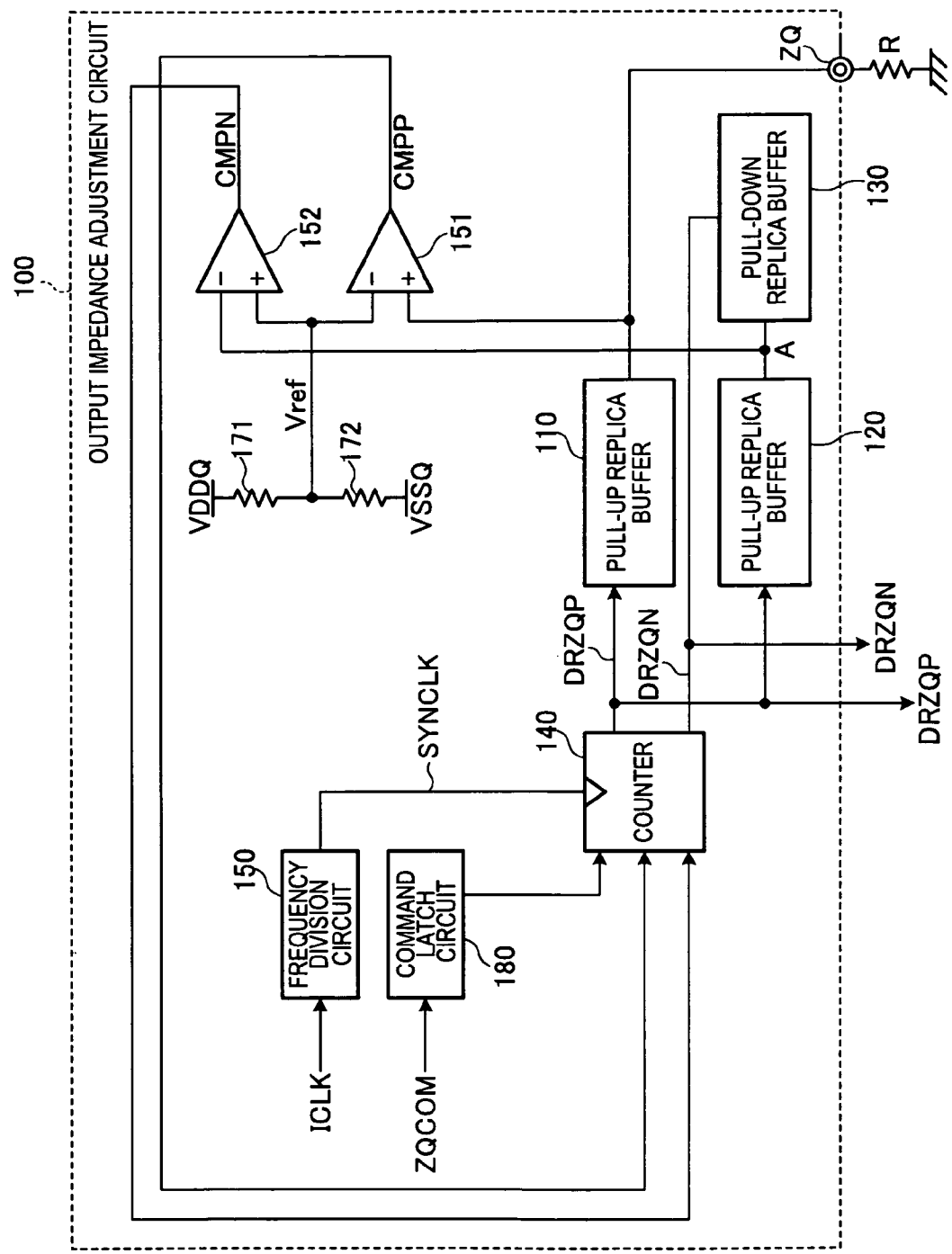
FIG. 2 is a block diagram showing the configuration of the output impedance adjustment circuit according to the first embodiment.

FIG. 2 is a block diagram showing the configuration of the output impedance adjustment circuit 100 according to the first embodiment.

As shown in FIG. 2, the output impedance adjustment circuit 100 includes a pull-up replica buffer 110 (first replica buffer), a pull-up replica buffer 120 (third replica buffer), and a pull-down replica buffer 130 (second replica buffer). The replica buffers 110, 120, and 130 have the same circuit configuration as that of part of an output buffer to be described later. The replica buffers 110, 120, and 130 are used to adjust output impedance. The result of adjustment is reflected on the output buffer to set the impedance of the output buffer to a desired value. This is the role of the output impedance adjustment circuit 100.

Figure 3:
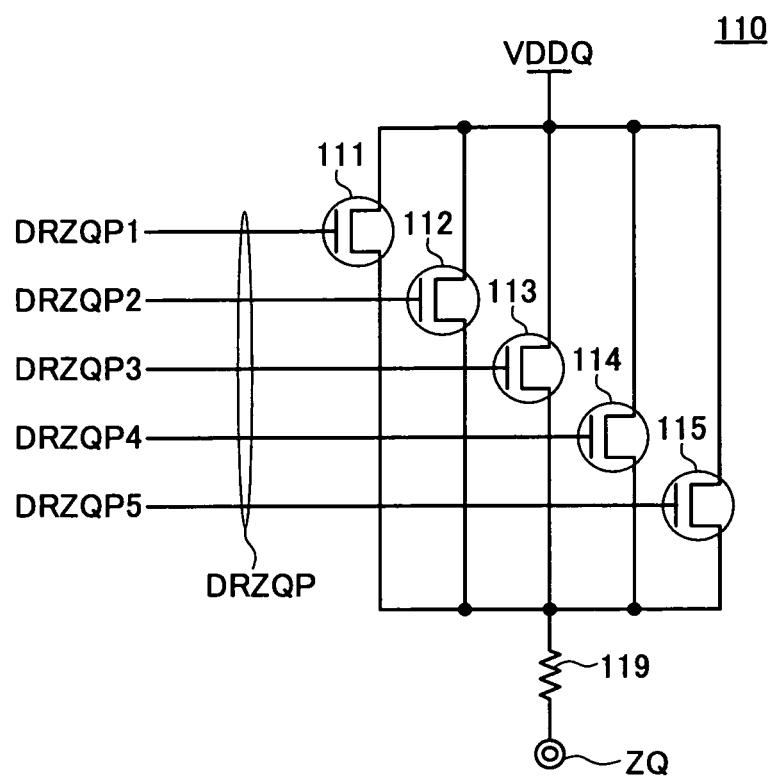
FIG. 3 is a circuit diagram of the pull-up replica buffer.

FIG. 3 is a circuit diagram of the pull-up replica buffer 110.

The pull-up replica buffer 110 includes five P-channel MOS transistors 111 to 115 which are connected in parallel to power supply wiring VDDQ (first power supply), and a resistor 119 which is connected at one end to the drains of the transistors. The other end of the resistor 119 is connected to the calibration terminal ZQ. The pull-up replica buffer 110 has only a pull-up function, not a pull-down function. The power supply wiring VDDQ is power supply wiring to which a high-potential power supply potential is supplied.

The gates of the transistors 111 to 115 receive respective corresponding bits of the pull-up impedance adjustment signal DRZQP (first adjustment code). This allows individual ON/OFF control on the five transistors included in the replica buffer 110.

The parallel circuit of the transistors included in the pull-up replica buffer 110 is designed to provide a predetermined impedance (for example, 120Ω) when in conduction. The desired impedance, however, is not always obtained since the ON resistance of a transistor can vary depending on the manufacturing condition as well as ambient temperature and power supply voltage during operation. To actually provide an impedance of 120Ω, the number of transistors to turn ON therefore needs to be adjusted. The parallel circuit of the plurality of transistors is used for that purpose.

The impedance can be finely adjusted over a wide range by giving respective different W/L ratios (gate width/gate length ratios) to the plurality of transistors constituting the parallel circuit, with weights of powers of 2 in particular. From such a point of view, in the present embodiment, the transistors 112 to 115 are given W/L ratios of 2WLp, 4WLp, 8WLp, and 16WLp, respectively, with the W/L ratio of the transistor 111 as 1WLp.

Using the pull-up impedance adjustment signal DRZQP, the transistor(s) to turn ON can be appropriately selected to fix the ON resistance of the parallel circuit to approximately 120Ω regardless of variations due to the manufacturing condition and changes in temperature.

The resistor 119 is designed to have a resistance of 120Ω, for example. When the parallel circuit composed of the transistors 111 to 115 turns ON, the pull-up replica buffer 110 therefore provides an impedance of 240Ω when viewed from the calibration terminal ZQ. The resistor 119 may be a tungsten (W) resistor, for example.

The pull-up replica buffer 120 has the same circuit configuration as that of the pull-up replica buffer 110 shown in FIG. 3 except in that the other end of the resistor 119 is connected to a connection node A (internal contact). The gates of the five transistors included in the pull-up replica buffer 120 also receive the pull-up impedance adjustment signal DRZQP (first adjustment code).

Figure 4:
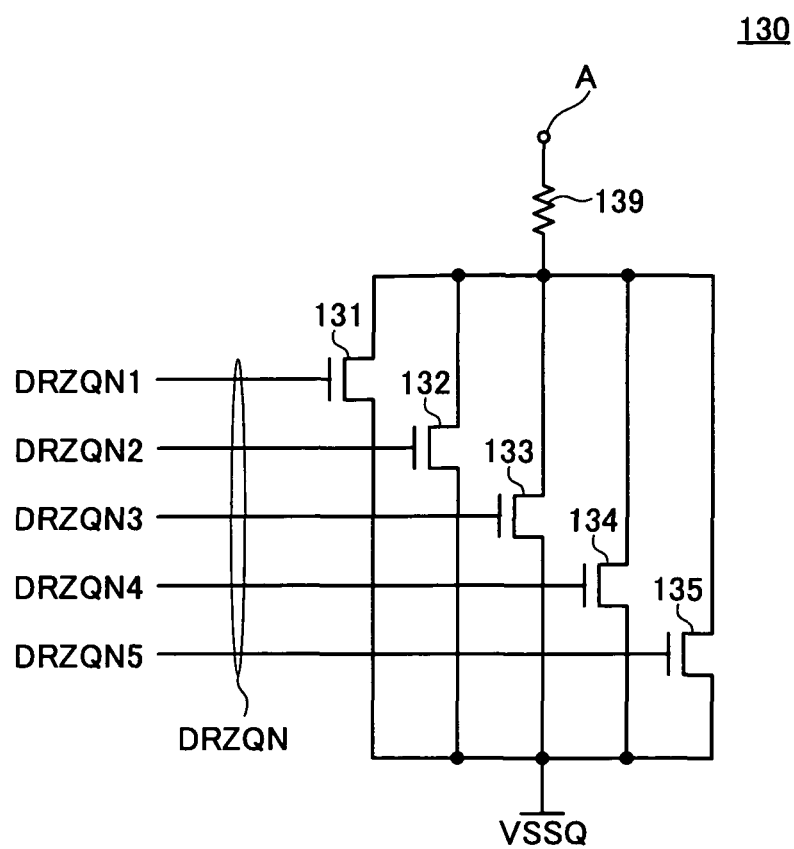
FIG. 4 is a circuit diagram of the pull-down replica buffer.

FIG. 4 is a circuit diagram of the pull-down replica buffer 130.

As shown in FIG. 4, the pull-down replica buffer 130 includes five N-channel MOS transistors 131 to 135 which are connected in parallel to ground wiring VSSQ (second power supply), and a resistor 139 which is connected at one end to the drains of the transistors. The other end of the resistor 139 is connected to the connection node A (internal contact). The replica buffer 130 has only a pull-down function, not a pull-up function. The ground wiring VSSQ is power supply wiring to which a low-potential power supply potential (ground potential) is supplied.

The gates of the transistors 131 to 135 receive respective corresponding bits of the pull-down impedance adjustment signal DRZQN (second adjustment code). This allows individual ON/OFF control on the five transistors included in the replica buffer 130.

The parallel circuit of the transistors included in the pull-down replica buffer 130 is also designed to be, for example, 120Ω when in conduction. The resistor 139 is also designed to have a resistance of 120Ω, for example. When the parallel circuit composed of the transistors 131 to 135 turns ON, the pull-down replica buffer 130 therefore provides an impedance of 240Ω when viewed from the connection node A, like the pull-up replica buffer 110 and 120.

As with the transistors 111 to 115, it is preferred that the transistors 131 to 135 have W/L ratios with weights of powers of 2 in particular. Specifically, the transistors 132 to 135 may be given W/L ratios of 2WLn, 4WLn, 8WLn, and 16WLn, respectively, with the W/L ratio of the transistor 131 as 1WLn.

Return to FIG. 2. The impedances of the pull-up replica buffer 110 and 120 and the pull-down replica buffer 130 are adjusted by the pull-up impedance adjustment signal DRZQP (first adjustment code) and the pull-down impedance adjustment signal DRZQN (second adjustment code) which are supplied from a counter 140 (binary scan counter). The pull-up impedance adjustment signal DRZQP and the pull-down impedance adjustment signal DRZQN have a 5-bit count value each. The transistors included in the pull-up replica buffers 110 and 120 and the pull-down replica buffer 130 are selectively turned ON/OFF by the 5-bit count values. The higher the count values, the lower the impedances are designed to be.

The counter 140 receives determination signals CMPP and CMPN from a comparator 151 (first comparator) and a comparator 152 (second comparator), respectively. The comparator 151 compares the output potential of the pull-up replica buffer 110 (the potential of the calibration terminal ZQ; hereinafter, referred to as a "ZQ potential") with a reference potential Vref. Specifically, the non-inverting input terminal (+) of the comparator 151 is connected to the calibration terminal ZQ. The inverting input terminal (−) is connected to the connection node between resistors 171 and 172. The resistors 171 and 172 are connected in series between the power supply wiring VDDQ and the ground wiring VSSQ. The potential of the connection node is the reference potential Vref. The following description will be given on the assumption that Vref=VDDQ/2. If the reference potential Vref>the ZQ potential, the determination signal CMPP becomes a low level. If the reference potential Vref<the ZQ potential, the determination signal CMPP becomes a high level.

The comparator 152 compares the potential of the connection node A (internal contact) between the pull-up replica buffer 120 and the pull-down replica buffer 130 (hereinafter, referred to as an "A potential") with the reference potential Vref. Specifically, the non-inverting input terminal (+) of the comparator 152 is connected to the connection node between the resistors 171 and 172. The inverting input terminal (−) is connected to the connection node A. The connection node A is the node where the pull-up replica buffer 120 and the pull-down replica buffer 130 are connected to each other. If the reference potential Vref>the A potential, the determination signal CMPN becomes a high level. If the reference potential Vref<the A potential, the determination signal CMPN becomes a low level.

A frequency division circuit 150 divides the frequency of the internal clock signal ICLK and supplies the resulting update clock signal SYNCLK having a lower frequency to the counter 140. The counter 140 updates the pull-up impedance adjustment signal DRZQP and the pull-down impedance adjustment signal DRZQN in synchronization with the update clock signal SYNCLK. A command latch circuit 180 latches the impedance adjustment command ZQCOM and supplies the impedance adjustment command ZQCOM to the counter 140. The counter 140 starts impedance adjustment processing when the impedance adjustment command ZQCOM is supplied thereto.

The foregoing is the structure of the output impedance adjustment circuit 100. The operation of the output impedance adjustment circuit 100 will be described in detail later.

Figure 5:
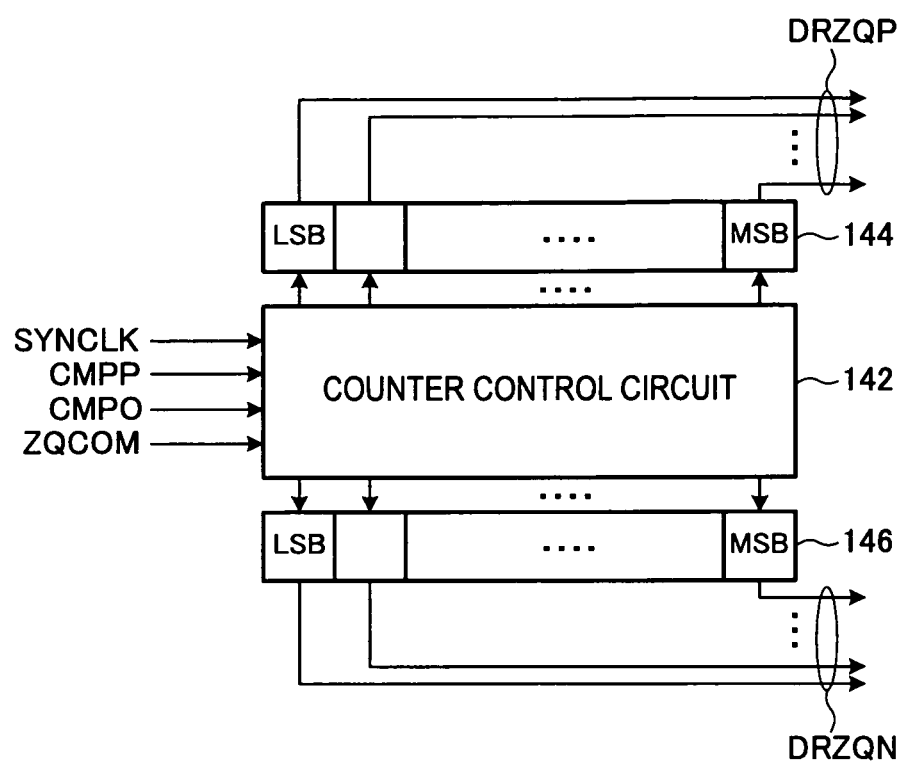
FIG. 5 is a circuit diagram of the counter.

FIG. 5 is a circuit diagram of the counter 140.

The counter 140 includes a counter control circuit 142, a pull-up counter 144, and a pull-down counter 146. The update clock signal SYNCLK, the determination signal CMPP, the determination signal CMPN, and the impedance adjustment command ZQCOM are supplied to the counter control circuit 142. When the impedance adjustment command ZQCOM is supplied, the counter control circuit 142 updates count values in synchronization with the update clock signal SYNCLK.

If the determination signal CMPP is at the high level (the reference potential Vref<the ZQ potential), the counter control circuit 142 counts down the count value of the pull-up counter 144. The value of the pull-up counter 144 is supplied to the pull-up replica buffers 110 and 120 as "the pull-up impedance adjustment signal DRZQP (first adjustment code)". As the count value decreases, the impedance of the pull-up replica buffer 110 increases to make the ZQ potential lower. As a result, the ZQ potential is adjusted to approach the reference potential Vref. That the ZQ potential approaches the reference potential Vref (the intermediate potential between VDDQ and VSSQ) means that the impedance of the pull-up replica buffer 110 approaches the external resistor R. From the same reason, the counter control circuit 142 counts up the count value of the pull-up counter 144 if the determination signal CMPP is at the low level (the reference potential Vref>the ZQ potential).

The same holds for the pull-down side. If the determination signal CMPN is at the high level (the reference potential Vref>the A potential), the counter control circuit 142 counts up the count value of the pull-down counter 146. If the determination signal CMPN is at the low level, the counter control circuit 142 counts down the count value. The count value of the pull-down counter 146 is supplied to the pull-down replica buffer 130 as "the pull-down impedance adjustment signal DRZQN". The counter control circuit 142 according to the first embodiment updates higher-order bits first, not lower-order bits first. Details will be given later.

Figure 6:
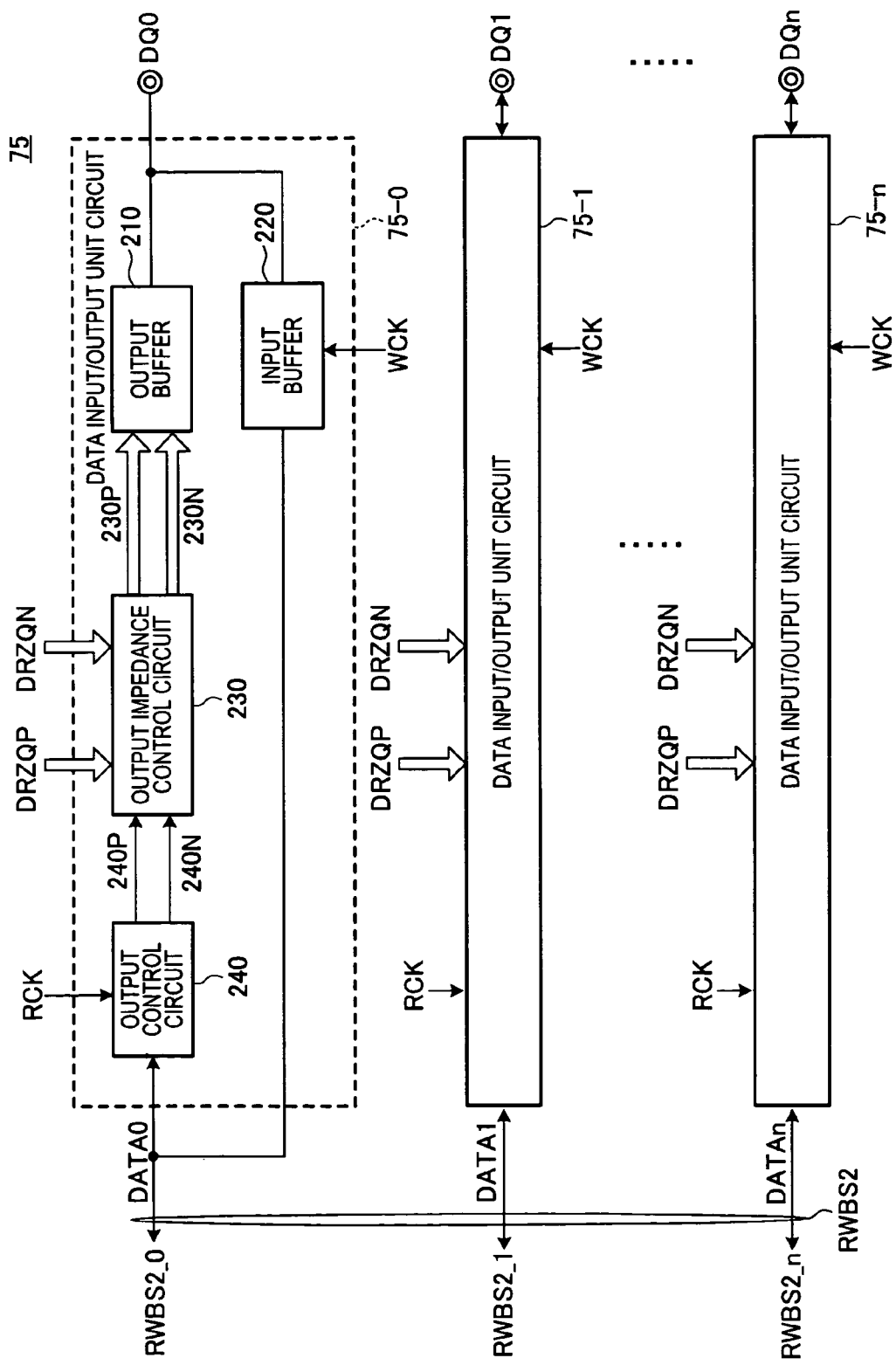
FIG. 6 is a block diagram showing the configuration of the data input/output unit.

FIG. 6 is a block diagram showing the configuration of the data input/output unit 75.

As shown in FIG. 6, the data input/output unit 75 includes a plurality of data input/output unit circuits 75_0 to 75_*n* which are provided for the respective data terminals DQ0 to DQn. The read timing signal RCK and the write timing signal WCK from the timing control unit 90 are supplied in common to the data input/output unit circuits 75_0 to 75_*n*. The pull-up impedance adjustment signal DRZQP and the pull-down impedance adjustment signal DRZQN from the output impedance adjustment circuit 100 are also supplied in common to the data input/output unit circuits 75_0 to 75_*n*. The data input/output unit circuits 75_0 to 75_*n* are connected to respective corresponding read/write lines RWBS2_0 to RWBS2_n. The read/write lines RWBS2_0 to RWBS2_n are the lines that constitute the read/write bus RWBS2 shown in FIG. 1.

The data input/output unit circuits 75_0 to 75_*n* each include an output control circuit 240, an output impedance control circuit 230, an output buffer 210 (first and second buffers), and an input buffer 220. As shown in FIG. 6, the data terminals DQ0 to DQn are connected to the output buffer 210 and the input buffer 220 in the respective corresponding data input/output unit circuits 75_0 to 75_*n*. The read/write lines RWBS2_0 to RWBS2_n are connected to the output control circuit 240 and the input buffer 220 in the respective corresponding data input/output unit circuits 75_0 to 75_*n*. Consequently, in a write operation, write data that is input to the data input/output terminals DQ0 to DQn is supplied to the read/write lines RWBS2_0 to RWBS2_n through the input buffers 220. The timing at which the write data is supplied to the read/write lines RWBS2_0 to RWBS2_n is controlled by the write timing signal WCK supplied to the input buffers 220. In a read operation, read data that output to the read/write lines RWBS2_0 to RWBS2_n is supplied to the data terminals DQ0 to DQn through the output control circuits 240, the output impedance control circuits 230, and the output buffers 210. The timing at which the read data is supplied to the output impedance control circuits 230 is controlled by the read timing signal RCK supplied to the output control circuits 240.

In response to the activation of the read timing signal RCK, each output control circuit 240 inverts read data DATA supplied from the corresponding read/write line, and outputs the resultant to the output impedance control circuit 230 as read data 240P and 240N.

Figure 7:
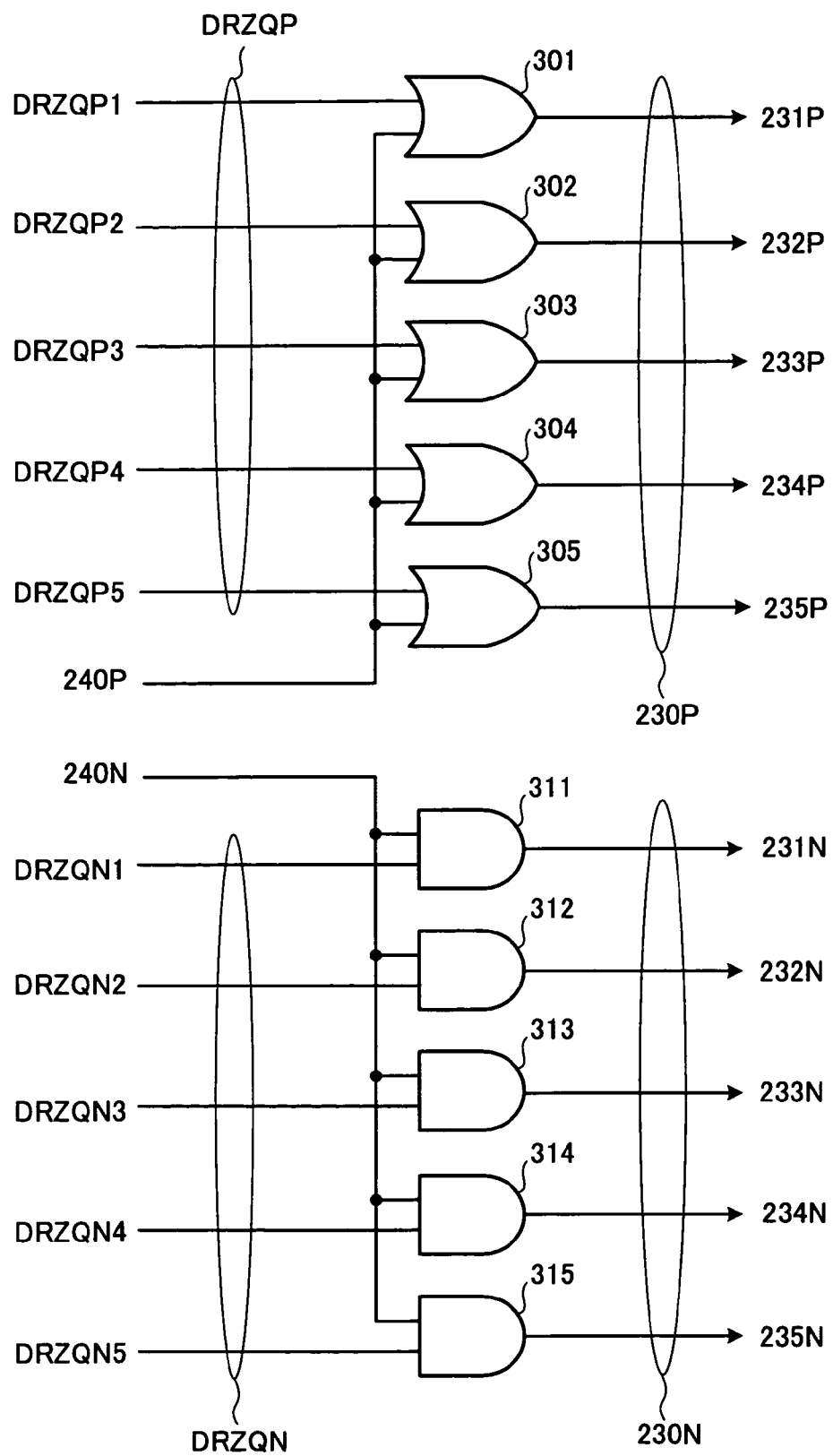
FIG. 7 is a circuit diagram of the output impedance control circuit.

FIG. 7 is a circuit diagram of the output impedance control circuit 230.

As shown in FIG. 7, the output impedance control circuit 230 includes five OR circuits 301 to 305 and five AND circuits 311 to 315. The read data 240P from the output control circuit 240 is supplied in common to the OR circuits 301 to 305. The OR circuits 301 to 305 also receive respective bits DRZQP1 to DRZQP5 of the pull-up impedance adjustment signal DRZQP (first adjustment code) from the output impedance adjustment circuit 100. Meanwhile, the read data 240N from the output control circuit 240 is supplied in common to the AND circuits 311 to 315. The AND circuits 311 to 315 also receive respective bits DRZQN1 to DRZQN5 of the pull-down impedance adjustment signal DRZQN (second adjustment code) from the output impedance adjustment circuit 100.

The outputs of the output control circuit 240, or read data 240P and 240N, are controlled according to such factors as the logical value of the data to be output from the corresponding data terminals DQ0 to DQn. Specifically, when the corresponding data terminals DQ0 to DQn output a high-level signal, the read data 240P and 240N is set to a low level. When the corresponding data terminals DQ0 to DQn output a low-level signal, the read data 240P and 240N is set to a high level. In the case of using an on-die termination (ODT) function with the output buffer 210 as the termination resistor, the read data 240P is set to the low level and the read data 240N the high level.

The outputs of the OR circuits 301 to 305 are operation signals 231P to 235P (=230P). The outputs of the AND signals 311 to 315 are operation signals 231N to 235N (=230N). The operation signals 230P and 230N are supplied to the output buffer 210 as shown in FIG. 6.

Figure 8:
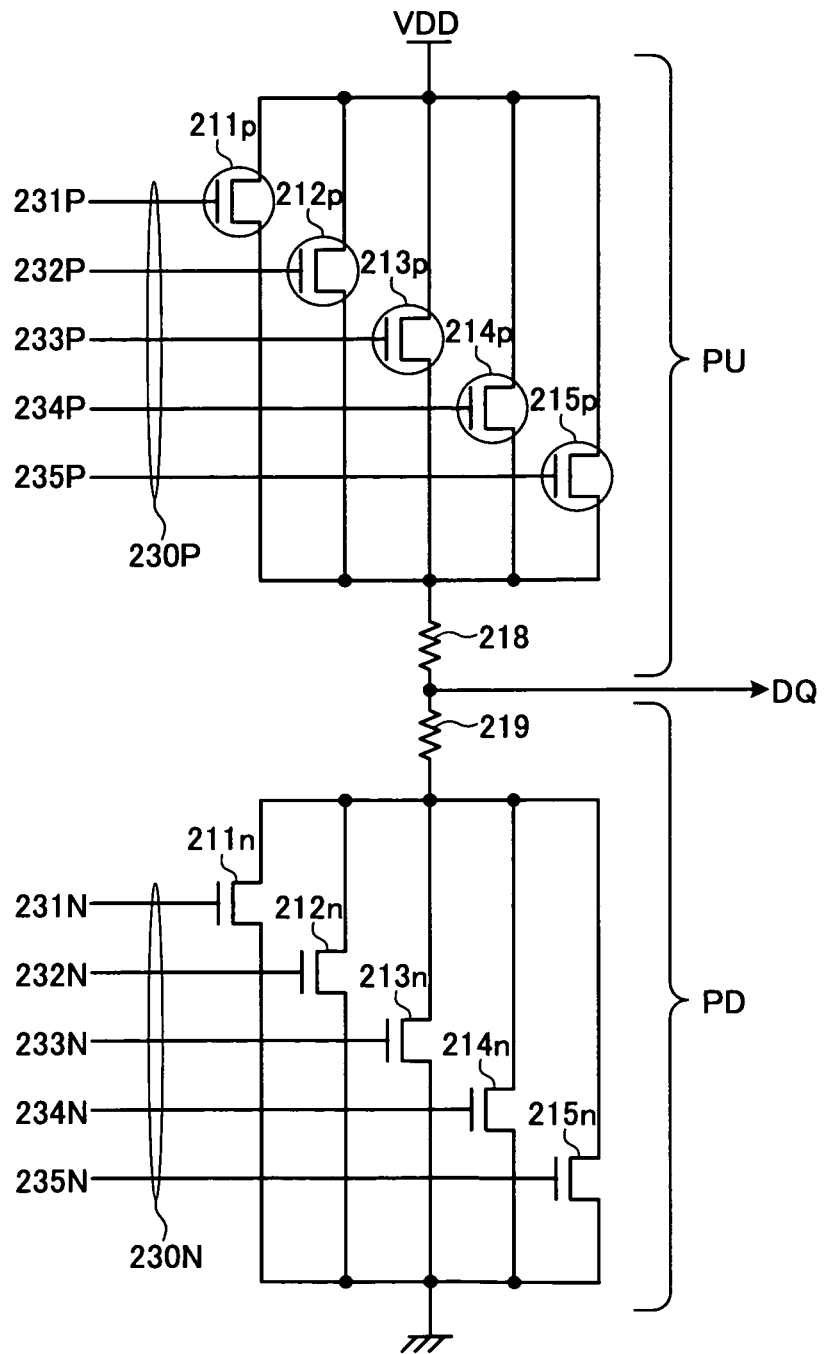
FIG. 8 is circuit diagram of the output buffer.

FIG. 8 is a circuit diagram of the output buffer 210.

As shown in FIG. 8, the output buffer 210 includes five P-channel MOS transistors 211p to 215p which are connected in parallel, and five N-channel MOS transistors 211n to 215n which are connected in parallel. Resistors 218 and 219 are connected in series between the transistors 211p to 215p and the transistors 211n to 215n. The node between the resistors 218 and 219 is connected to the corresponding data terminals DQ0 to DQn.

The five operation signals 231P to 235P that constitute the operation signal 230P are supplied to the gates of the transistors 211p to 215p, respectively. The five operation signals 231N to 235N that constitute the operation signal 230N are supplied to the gates of the transistors 211n to 215n, respectively. Consequently, the ten transistors included in the output buffer 210 are individually controlled ON/OFF by the ten operation signals 231P to 235P and 231N to 235N. The operation signals 231P to 235P are a group of signals constituting the operation signal 230P. The operation signals 231N to 235N are a group of signals constituting the operation signal 230N.

In the output buffer 210, the P-channel MOS transistors 211p to 215p and the resistor 218 constitute a pull-up circuit PU (first buffer). The pull-up circuit PU has the same circuit configuration as that of the replica buffer 110 (120) shown in FIG. 3. The N-channel MOS transistors 211n to 215n and the resistor 219 constitute a pull-down circuit PD (second buffer). The pull-down circuit PD has the same circuit configuration as that of the replica buffer 130 shown in FIG. 4.

Specifically, the parallel circuit of the transistors 211p to 215p and the parallel circuit of the transistors 211n to 215n both are designed to be, for example, 120Ω when in conduction. The resistors 218 and 219 both are designed to have a resistance of 120Ω, for example. Consequently, when either the parallel circuit of the transistors 211p to 215p or the parallel circuit of the transistors 211n to 215n turns ON, the output buffer 210 provides an impedance of 240Ω when viewed from the corresponding data terminals DQ0 to DQn.

Figure 9:
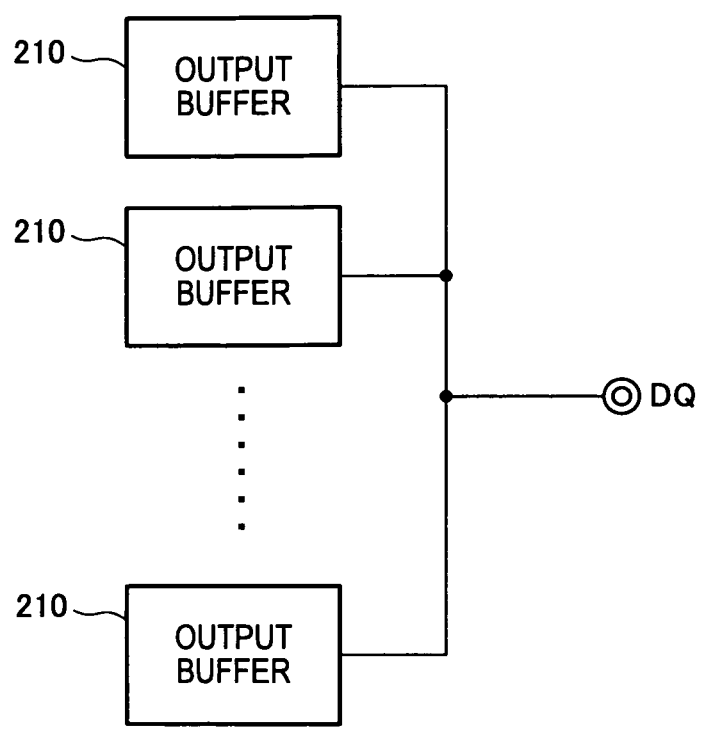
FIG. 9 is circuit diagram showing the configuration in which a plurality of output buffers are connected to a data input/output terminal in common.

In an actual semiconductor device, a plurality of output buffers 210 are provided in parallel with respect to a single data terminal DQ as shown in FIG. 9, so that the output impedance can be selected by the number of output buffers used. More specifically, the output impedance can be set to X/Y, where X is the impedance of an output buffer and Y is the number of output buffers used in parallel.

Figure 10:
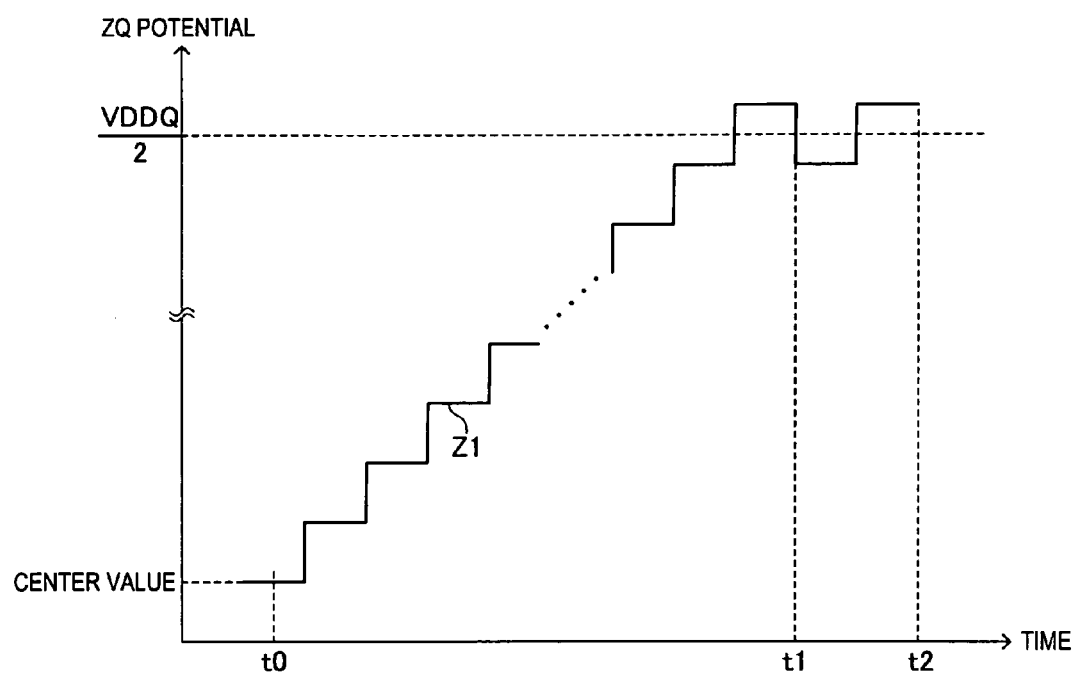
FIG. 10 is a time chart showing a typical process of impedance adjustment.

FIG. 10 is a time chart showing a typical process of impedance adjustment. Here, description will be given for the case of adjusting the impedance of the pull-up replica buffer 110. The comparator 151 compares the reference potential Vref and the ZQ potential. According to the comparison result, the counter 140 adjusts the impedance Z1 of the pull-up replica buffer 110. The purpose of the adjustment is to bring the impedance Z1 close to the external resistor R. The impedance Z1 approaches the external resistor R as the ZQ potential approaches the reference potential Vref.

The count value is expressed in five bits and thus ranges from 0 to 31. When the count value=00000 (=0), all the transistors 111 to 115 of the pull-up replica buffer 110 are OFF. When the count value=11111 (=31), all the transistors 111 to 115 of the pull-up replica buffer 110 are ON. In other words, a count value of 00000 (=0) maximizes the impedance Z1 of the pull-up replica buffer 110. A count value of 11111 (=31) minimizes the impedance Z1. Since the optimum count value is unknown at power-on, the count value is initially set to 10000 (=16). The count value of 10000 (=16) is the center value of 0 to 31.

According to FIG. 10, when the count value=the center value, the ZQ potential<the reference potential Vref (=VDDQ/2). The impedance Z1 should be lowered stepwise. After the ZQ potential exceeds the reference potential Vref, the counter 140 performs down and up operations as checking operations (time t1 to t2) before fixing the count value. Suppose that the ZQ potential exceeds the reference potential Vref when the count value=11111 (=31). In such a case, the number of counts needed to detect the optimum value (=31), starting at the center value (=16), is 31−16+2=17. The last two counts are for the checking operations.

If the optimum value is less than 31, the number of counts is less than 17. Since the maximum count value is 31, the maximum number of counts needed for the impedance adjustment of the pull-up replica buffer 110 is 17. Hereinafter, the method of adjusting the impedance by updating the count value by one at a time as shown in FIG. 10 will be referred to as a "sequential method."

With the pull-down replica buffer 130, again, the maximum number of counts is 17. The maximum time provided for the calibration purpose is defined to be 512 clock-times. If both the pull-up and pull-down operations take 17 counts, the determination time available for the comparators 151 and 152 is 512/(17×2)=approximately 15 clock-times. Assuming that one clock-time of the internal clock signal ICLK is 1.5 (nsec), the determination time available is 1.5×15=22.5 (nsec). If one clock-time of the internal clock signal ICLK is speeded up to 0.87 (nsec), the determination time available decreases to 0.87×15=13.0 (nsec). The determination time can be even shorter if the external clock signal CK is further accelerated in the future.

Figure 11:
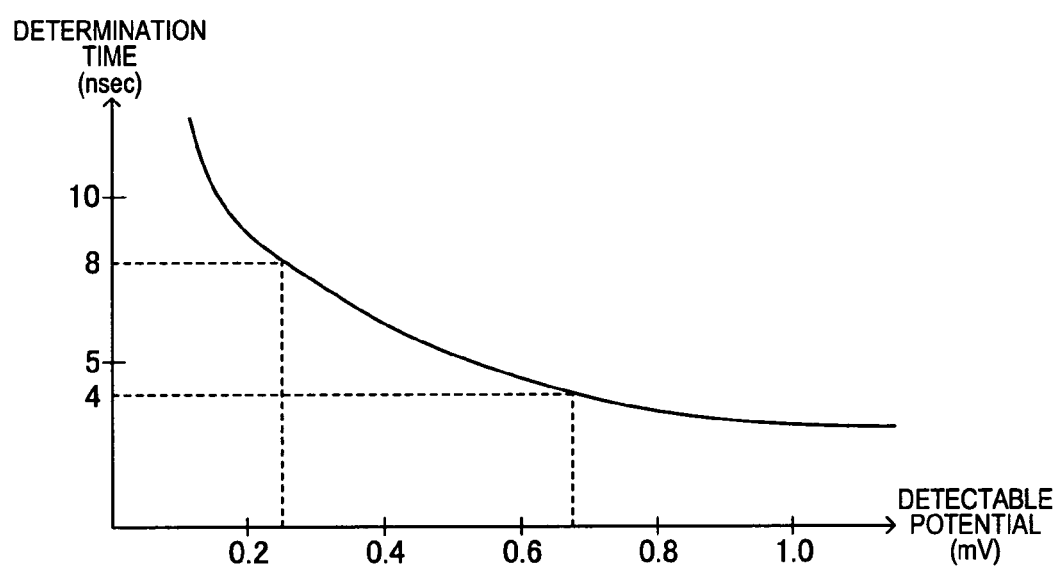
FIG. 11 is a graph showing the relationship between the measurement accuracy and the determination time of the comparators.

FIG. 11 is a graph showing the relationship between the measurement accuracy and the determination time of the comparators.

The horizontal axis represents the detectable potential and the vertical axis the determination time. The shorter the determination time, the higher the detectable potential. In other words, it becomes more difficult to detect a small difference in potential as the determination time decreases. A comparator having the characteristic shown in FIG. 11 can detect a potential difference as small as approximately 0.25 (mV) if a determination time of 8 (nsec) is available. If the determination time available is only 4 (nsec), potential differences smaller than approximately 0.68 (mV) are not detectable. A sufficient determination time is needed in order for the comparators 151 and 152 to properly detect a small difference between voltage signals.

If the external clock signal CK and the internal clock signal ICLK are increased in frequency, the shorter clock-time makes it difficult to secure a sufficient determination time. The generation of the low-frequency update clock signal SYNCLK by the frequency division circuit 150 allows a long determination time. The frequency division is not limitless, however. For example, the maximum time needed for calibration without frequency division is only 17×2=34 clock-times out of the 512 clock-times. With 16-fold frequency division, the maximum time needed for calibration reaches 17×16×2=544 clock times. In other words, the frequency division is allowed only up to eightfold in terms of design.

Figure 12:
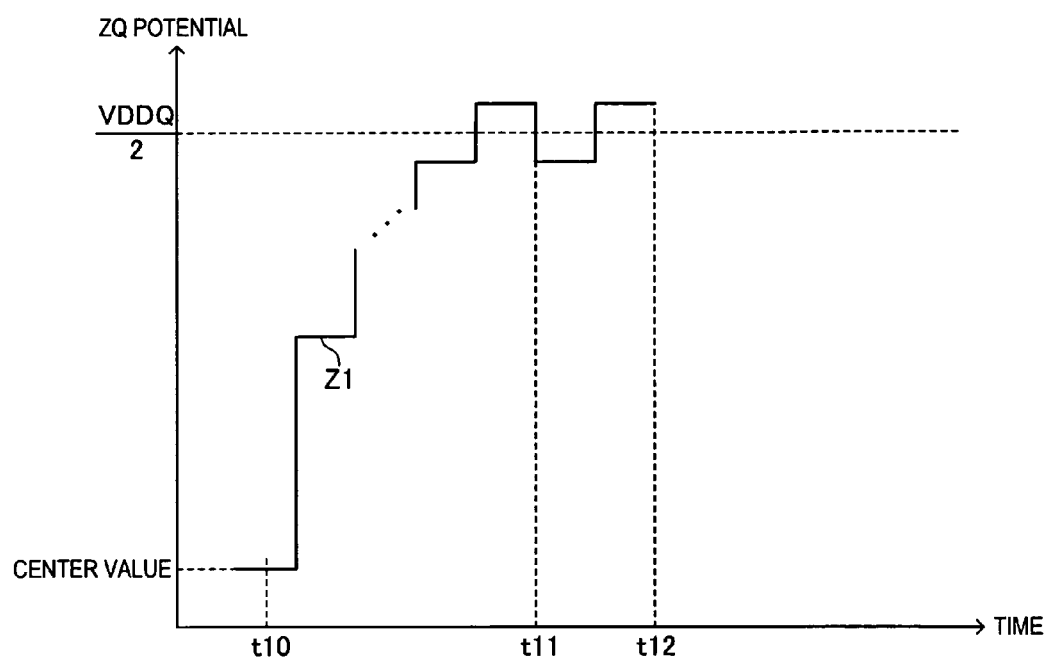
FIG. 12 is a time chart showing the process of impedance adjustment according to the first embodiment.

FIG. 12 is a time chart showing the process of impedance adjustment according to the first embodiment. Again, description will be given for the case of adjusting the impedance of the pull-up replica buffer 110. The comparator 151 compares the reference potential Vref and the ZQ potential. According to the comparison result, the counter 140 adjusts the impedance Z1 of the pull-up replica buffer 110. In the first embodiment, again, the count value at power-on is initialized to 10000 (=16).

In FIG. 12, again, the ZQ potential<the reference potential Vref when the count value=the center value. The impedance Z1 should be lowered stepwise. The count value is counted up. In the first embodiment, the count value of "10000 (=16)" is updated to "11000 (=24)," not "10001 (=17)." If the ZQ potential at the count value of 11000 (=24) is still lower than the reference potential Vref, the upper two bits are fixed to "11" and the count value is updated to "11100 (=28)." If the ZQ potential at the count value of 11100 (=28) exceeds the reference potential Vref, the upper three bits are fixed to "110" and the count value is updated from "11100 (=28)" to "11010 (=26)." Such a method of impedance adjustment will be referred to as a "binary search method." With the sequential method, the count value is counted up/down from the lower-order bits in succession. With the binary search method, the count value is counted up/down from the higher-order bits in succession.

If the ZQ potential>the reference potential Vref, the counter 140 performs down and up operations as checking operations (time t11 to t12) before fixing the count value. Suppose that the ZQ potential exceeds the reference potential Vref when the count value=11111 (=31). In such a case, the number of counts needed to detect the optimum value (=31), starting at the center value (=16), is six. More specifically, the count value changes in the following order: "10000 (=16) "→"11000 (=24)"→"11100 (=28)"→"11110 (=30)"→"11111 (=31)"→"11110 (=30)"→"11111 (=31)." The number of counts is extremely small as compared to the 17 counts according to the sequential method. With the binary search method, the maximum number of counts, i.e., the maximum number of voltage comparison operations can be suppressed to secure a sufficient determination time.

Figure 13:
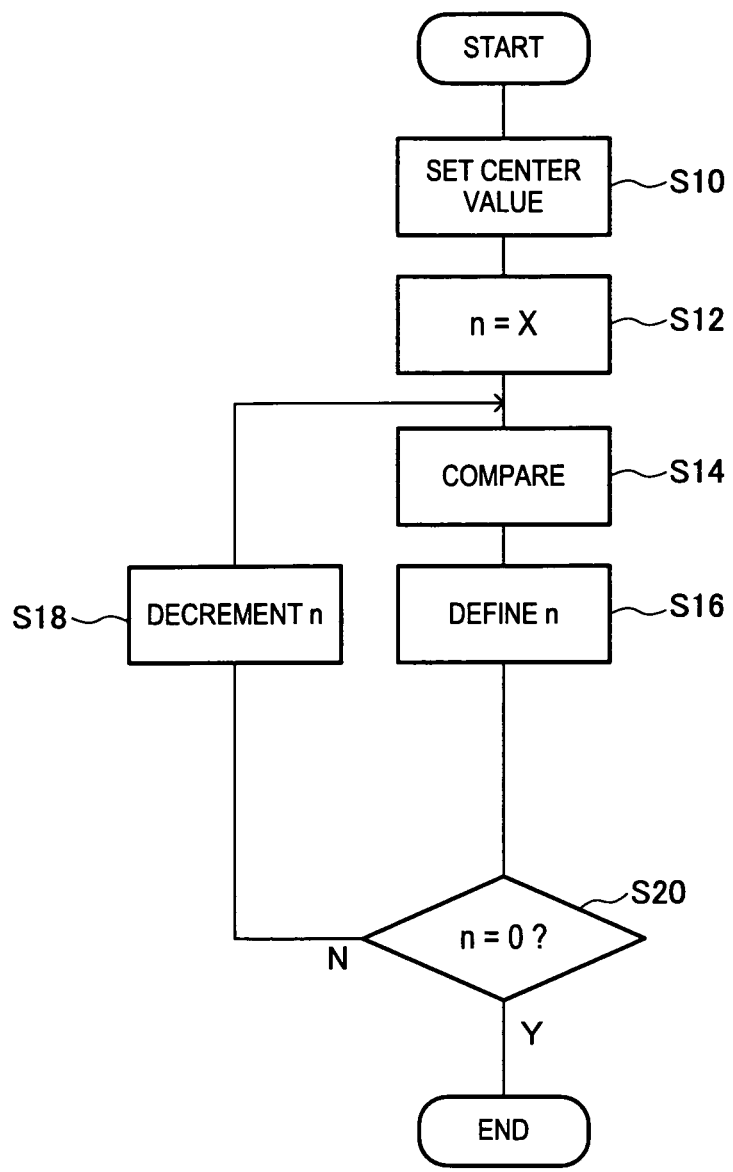
FIG. 13 is a flowchart showing the process of impedance adjustment according to the first embodiment.

FIG. 13 is a flowchart showing the process of impedance adjustment according to the first embodiment. Here, description will be given for the case of adjusting the impedance of the pull-up replica buffer 110. Initially, the counter control circuit 142 sets the center value "10000 (=16)" into the pull-up counter 144 (S10). Assuming that n is the number of digits, the most significant bit (MSB) is expressed as n=4, and the least significant bit (LSB) n=0.

The counter control circuit 142 sets "1" into the digit of n=X (S12). Here, X designates the digit next to the most significant bit, i.e., the third digit. The resulting count value="11000 (=24)." The comparator 151 performs voltage comparison, and outputs the comparison result as the CMPP signal (S14). If the ZQ potential>the reference potential Vref, the third digit is fixed to "0." If the ZQ potential is still lower than the reference potential Vref, the third digit is fixed to "1" (S16). If n=0, i.e., the least significant digit is fixed (Y in S20), the impedance adjustment ends. If the least significant bit is not fixed yet, the counter control circuit 142 decrements n to shift the operation target to one digit lower (S18).

The impedance of the pull-down replica buffer 130 is adjusted in a similar way. For pull-down, the comparator 152 outputs the comparison result as the CMPN signal in S14. Based on the CMPN signal, the count value is operated from the upper digits in succession for impedance adjustment.

Figure 14:
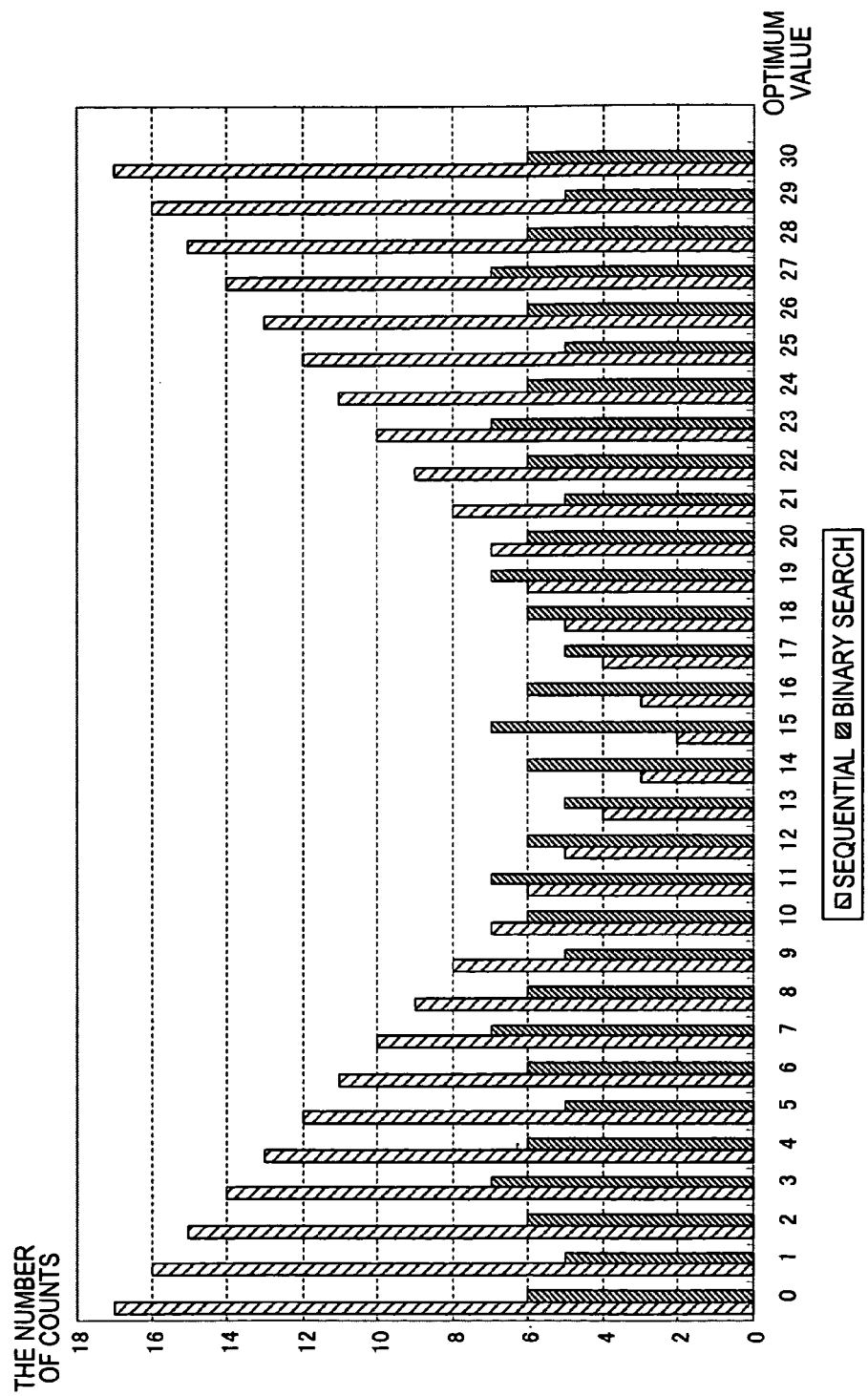
FIG. 14 is a graph for comparing the numbers of counts according to the sequential method and the binary search method.

FIG. 14 is a graph for comparing the numbers of counts according to the sequential method and the binary search method. The graph shows the case where the center value=15. According to the sequential method, the number of counts needed for an optimum value=15 is only two, which are for the checking purpose. If an optimum value=30, the number of counts needed is 30−15+2=17.

According to the binary search method, the number of counts needed for an optimum value=15 is seven. If an optimum value=30, the number of counts needed is six. In the case of the binary search method, the number of counts is suppressed to seven or fewer. When the optimum value is close to the center value, the sequential method is more advantageous than the binary search method. The binary search method, however, can suppress the number of counts to seven or fewer. The smaller number of counts, i.e., the smaller number of voltage comparisons leads to a design that easily allows a sufficient determination time.

Second Embodiment

Figure 15:
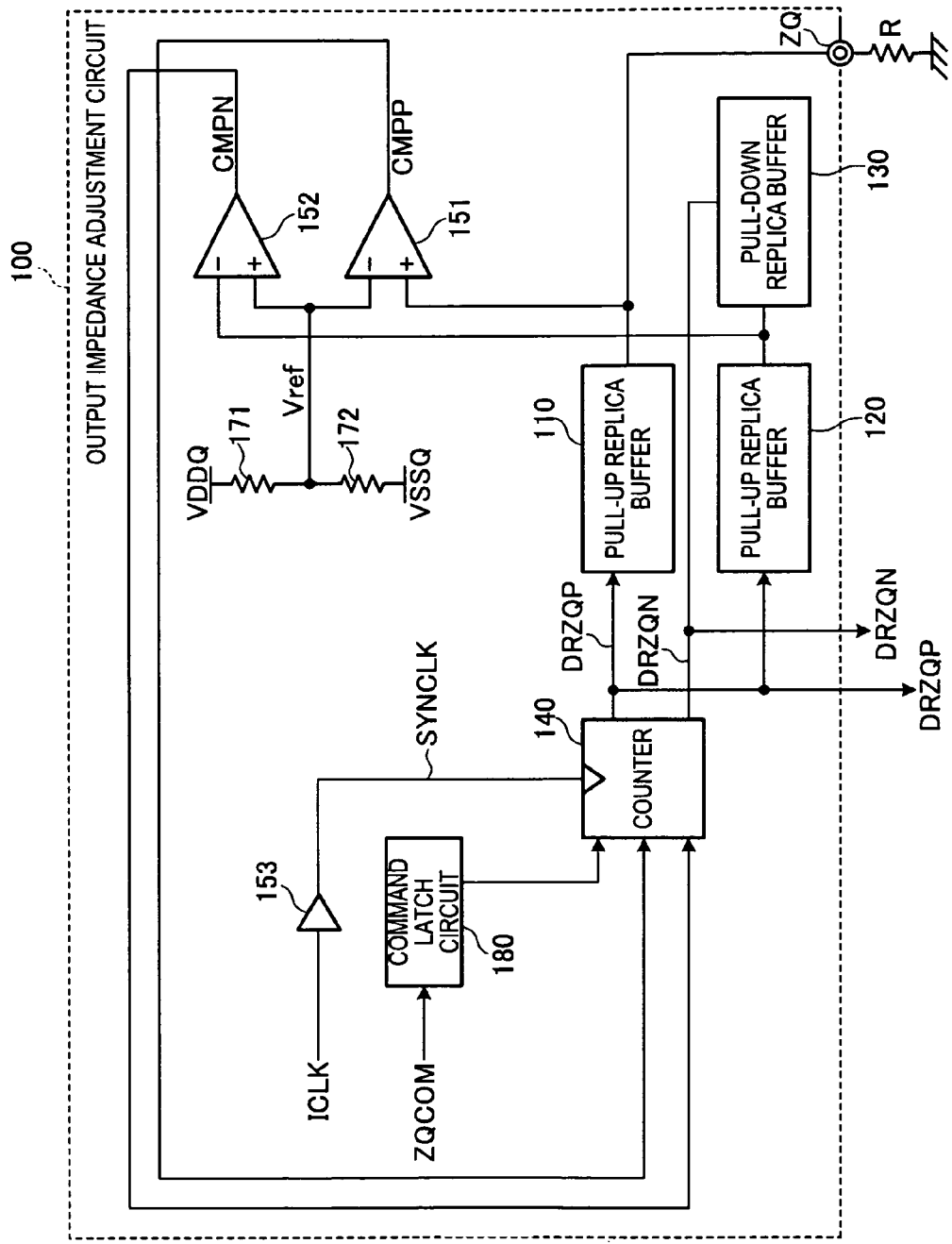
FIG. 15 is a block diagram showing the configuration of an output impedance adjustment circuit according to a second embodiment.

FIG. 15 is a block diagram showing the configuration of an output impedance adjustment circuit according to a second embodiment.

The configuration and control method of the semiconductor device according to the second embodiment are the same as in the first embodiment. The only difference lies in that the frequency division circuit 150 is replaced with a buffer 153. The frequency division circuit 150 is dispensable if the internal clock signal ICLK need not be divided in frequency to generate the update clock signal SYNCLK. For example, the frequency division is not needed when the internal clock signal ICLK is low in speed.

Third Embodiment

Figure 16:
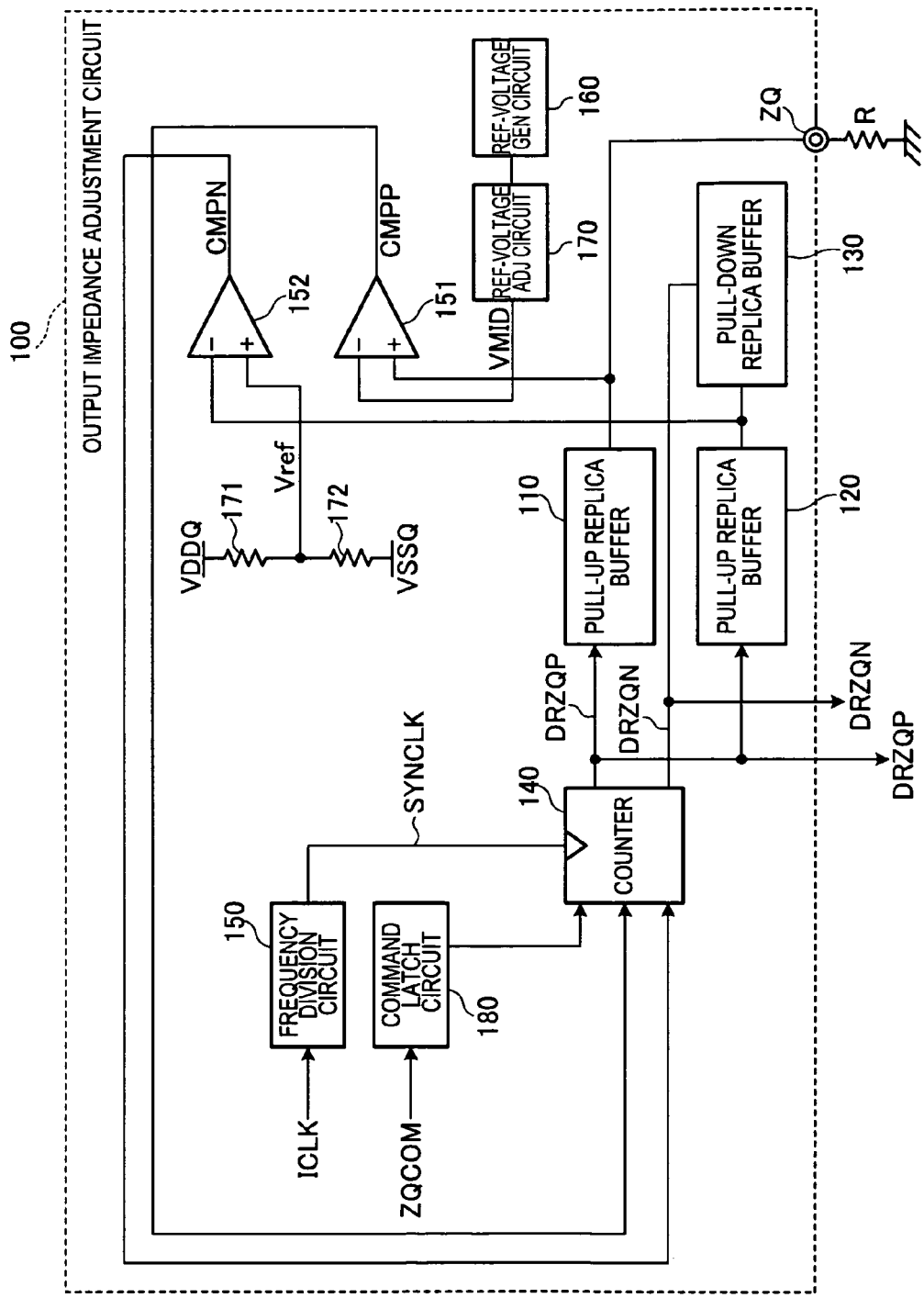
FIG. 16 is a block diagram showing the configuration of an output impedance adjustment circuit according to a third embodiment.

FIG. 16 is a block diagram showing the configuration of an output impedance adjustment circuit according to a third embodiment.

The external resistor R is in fact connected to an external terminal on a package. There is therefore some resistance component between the ZQ terminal on the chip and the external terminal on the package. As a result, the impedances of the replica buffers may be adjusted to the sum of the resistance of the external resistor R and the resistance component on the package, being slightly different from a desired value. In third and fourth embodiments, the reference voltage is made adjustable in order to deal with the resistance component lying between the ZQ terminal and the external terminal.

Again, the configuration and control method of the semiconductor device according to the third embodiment are basically the same as in the first embodiment. In the third embodiment, the non-inverting input terminal (+) of the comparator 151 is connected to the calibration terminal ZQ. The inverting input terminal (−) is connected to a reference voltage generation circuit 160. The reference voltage generation circuit 160 generates a reference voltage VMID which is approximately one half of the power supply voltage (VDDQ–VSSQ). As will be described later, the level of the reference voltage VMID is finely adjusted by a reference voltage adjustment circuit 170. The comparator 151 outputs the determination signal CMPP of high level if the ZQ potential>the reference voltage VMID, and outputs the determination signal CMPP of low level if not.

Figure 17:
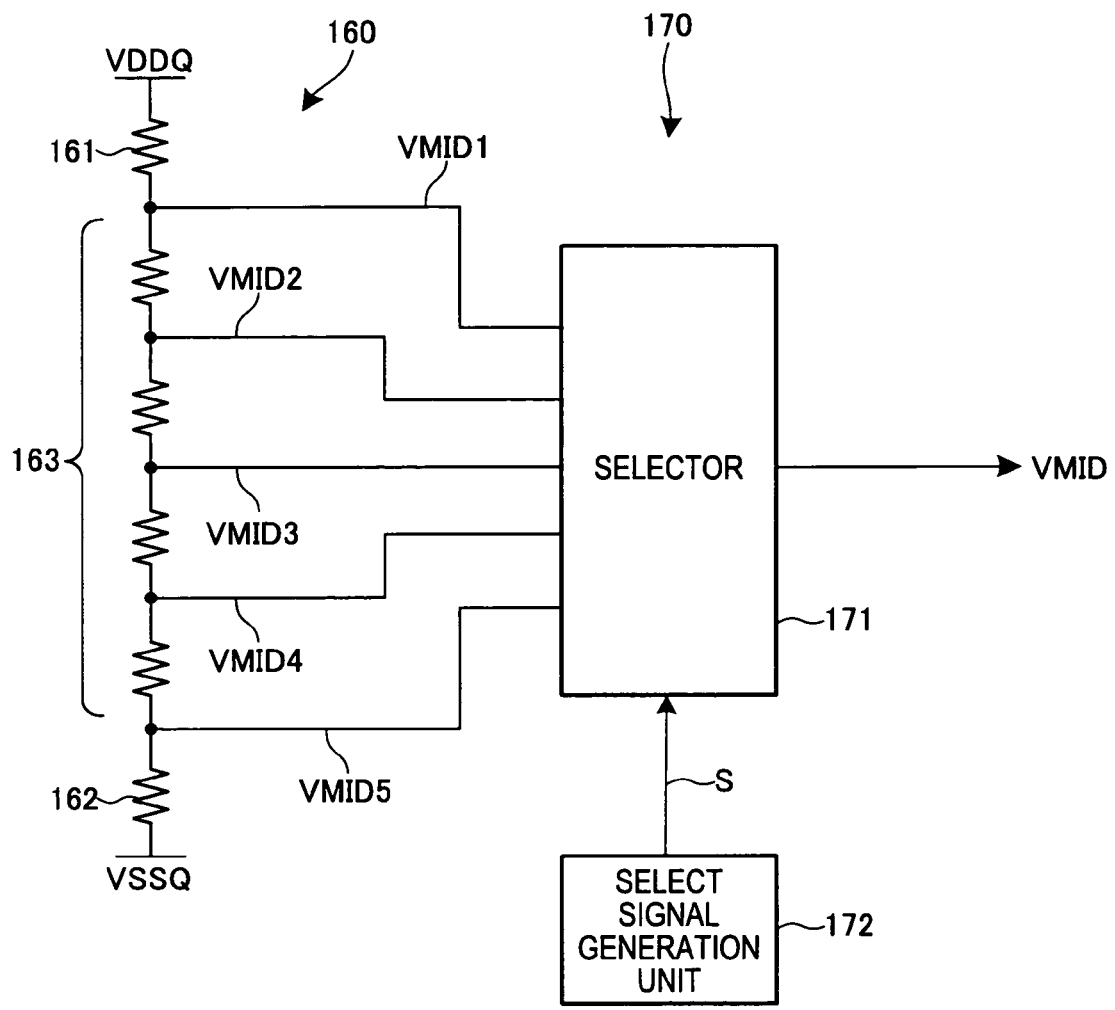
FIG. 17 is a circuit diagram of the reference voltage generation circuit and the reference voltage adjustment circuit.

FIG. 17 is a circuit diagram of the reference voltage generation circuit 160 and the reference voltage adjustment circuit 170.

The reference voltage generation circuit 160 includes a plurality of resistors 161 to 163 which are connected in series between the power supply potential VDDQ and the ground potential VSSQ. Reference voltages VMID1 to VMID5 are taken out from between the resistors, respectively. The reference voltage generation circuit 160 thus generates a plurality of reference voltages having respective different levels.

Among the resistors 161 to 163, the resistor 161 connected to the power supply potential VDDQ and the resistor 162 connected to the ground potential VSSQ have relatively high resistances. The resistors 163 connected between the resistors 161 and 162 have relatively low resistances. All the plurality of reference voltages VMID1 to VMID5 are taken out from the low resistance section consisting of the resistors 163. The aim is to make small the voltage differences between the plurality of reference voltages VMID1 to VMID5. It is preferred, though not limited in particular, that the high resistance section consisting of the resistors 161 and 162 be made of diffusion layer resistors, and that the low resistance section consisting of the resistors 163 be made of tungsten (W) or other wiring resistors.

The reference voltage adjustment circuit 170 includes a selector 171 and a select signal generation unit 172. The selector 171 receives the reference voltages VMID1 to VMID5 generated by the reference voltage generation circuit 160, and outputs any one of the reference voltages VMID1 to VMID5. The selection is made based on a select signal S from the select signal generation unit 172.

Write processing on the select signal generation unit 172 is performed during manufacturing or after manufacturing. It is preferred that the select signal generation unit 172 include a nonvolatile memory element so that the content of the select signal S is retained after the write processing. The nonvolatile memory element is not limited to any particular type, whereas it is preferred to use an electrically writable element. Examples of the electrically writable element include an antifuse. In an initial state (before the operation of adjusting the reference voltage to be described later), a voltage closest to the intermediate voltage (VDD/2) is selected among the reference voltages VMID1 to VMID5.

Fourth Embodiment

Figure 18:
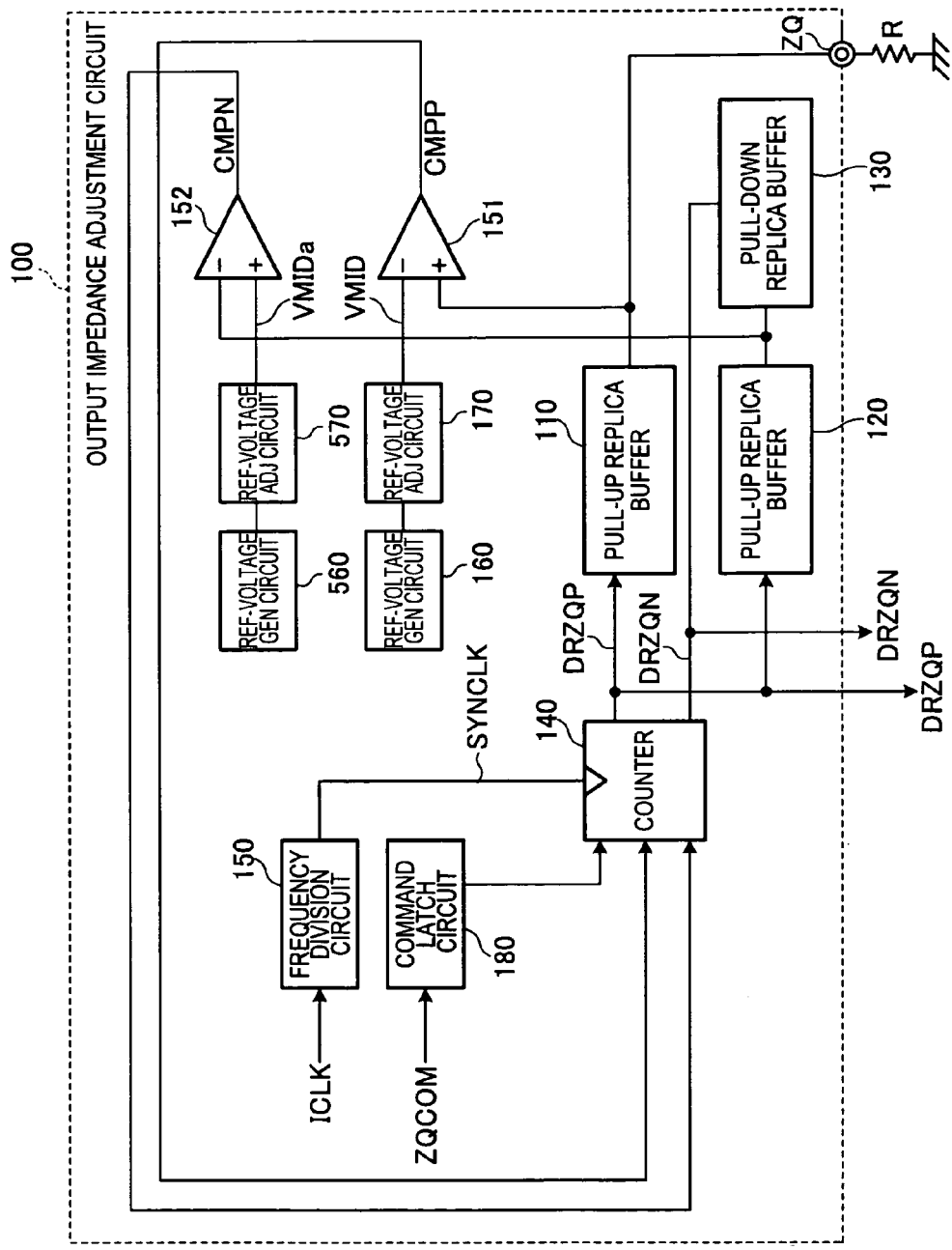
FIG. 18 is a block diagram showing the configuration of an output impedance adjustment circuit according to a fourth embodiment.

FIG. 18 is a block diagram showing the configuration of an output impedance adjustment circuit according to a fourth embodiment.

Again, the configuration and control method of the semiconductor device according to the fourth embodiment are basically the same as in the first embodiment. In the fourth embodiment, the non-inverting input terminal (+) of the comparator 152 is connected to the connection node A. The inverting input terminal (−) is connected to a reference voltage generation circuit 560. The reference voltage generation circuit 560 generates a reference voltage VMIDa which is approximately one half of the power supply voltage (VDDQ–VSSQ).

The reference voltage VMIDa supplied to the comparator 152 can be offset by the reference voltage generation circuit 560 and a reference voltage adjustment circuit 570. The reference voltage generation circuit 560 and the reference voltage adjustment circuit 570 have the same circuit configuration as that of the reference voltage generation circuit 160 and the reference voltage adjustment circuit 170 shown in FIG. 17.

The reference voltage VMIDa is offset for the purpose of making more uniform the rising waveform and falling waveform of the output signal that is output from the data input/output terminal DQ. More specifically, the P-channel MOS transistors 211$p$ to 215$p$ constituting the output buffer 210 and the N-channel MOS transistors 211$n$ to 215$n$ have somewhat different I-V characteristics (current-voltage characteristics). This can make the rising waveform and the falling waveform nonuniform even if the two types of MOS transistors have the same ON resistance. Such a difference in waveform can be eliminated by creating a slight difference between the ON resistance of the P-channel MOS transistors 211$p$ to 215$p$ constituting the output buffer 210 and that of the N-channel MOS transistors 211$n$ to 215$n$.

From such a point of view, the fourth embodiment is configured so that the reference voltage for use in the impedance adjustment of the pull-down replica buffer 130 can also be offset. As a result, it is possible to make the rising waveform and falling waveform of the output signal more uniform.

The present invention has been described so far with reference to several embodiments thereof. Such embodiments have been given by way of illustration. It will be understood by those skilled in the art that various modifications and alterations may be made within the scope of claims of the present invention, and such modifications and alterations are also intended to fall within the scope of claims of the present invention. The description of the specification and the drawings are therefore to be considered exemplary, not restrictive.

In addition, while not specifically claimed in the claim section, the applicant reserves the right to include in the claim section of the application at any appropriate time the following methods:

A1. A method of adjusting a characteristic of a semiconductor device comprising:

changing an impedance of a first replica buffer based on a first adjustment code output from a first counter, the first replica buffer being connected between a calibration terminal and a first power supply;

comparing a voltage of the calibration terminal with a first reference voltage; and updating the first adjustment code retained in the first counter based on the result of comparison between the voltage of the calibration terminal and the first reference voltage, when updating the first adjustment code, updating the first adjustment code retained in the first counter from higher-order bits.

A2. The method of adjusting a characteristic of a semiconductor device as A1 further comprising:

changing an impedance of a second replica buffer based on a second adjustment code output from a second counter, the second replica buffer being connected between an internal contact and a second power supply;

comparing a voltage of the internal contact with a second reference voltage; and updating the second adjustment code retained in the second counter based on the result of comparison between the voltage of the internal contact and the second reference voltage, when updating the second adjustment code, updating the second adjustment code retained in the second counter from higher-order bits.

A3. The method of adjusting a characteristic of a semiconductor device A2, further comprising matching an impedance between the first power supply and the internal contact with the impedance of the first replica buffer.

What is claimed is:

1. A semiconductor device comprising:
    an output buffer;
    a calibration terminal to be coupled to an external resistor; and
    a control circuit coupled to the output buffer and the calibration terminal, controlling an output impedance of the output buffer in response to the external resistor, the control circuit comprising a counter, the output impedance of the output buffer being dependent on a count value of the counter, the count value being represented by a plurality of bits including a most significant bit and a least significant bit, and configured to be changed from one of more significant bits inclusive of the most significant bit,
wherein the count value is variable under a maximum value and the most significant bit is initialized such that the count value takes a half of the maximum value when the control circuit receives a calibration command.

2. The semiconductor device as claimed in claim 1, wherein the count value is further represented by additional bits between the most and least significant bits, one of the additional bits being controlled to be changed next to a changing of another of the additional bits, and the another of the additional bits being more significant than the one of the additional bits.

3. The semiconductor device as claimed in claim 1, wherein the control circuit further comprises:
    a replica buffer coupled to the calibration terminal through a first node; and
    a comparator comparing in voltage the first node with a second node supplied with a reference voltage to produce a control signal,
    each of the plurality of bits being changed in response to the control signal.

4. The semiconductor device as claimed in claim 1, wherein the output buffer includes a first conductive type transistor and a second conductive type transistor, an output impedance of the first conductive type transistor being dependent on the count value of the counter of the control circuit,
    the control circuit further comprising an additional counter, an output impedance of the second conductive type transistor of the output buffer being dependent on a count value of the additional counter, the count value of the additional counter being represented by a plurality of bits including an additional most significant bit and an additional least significant bit, and configured to be changed from one of additional more significant bits inclusive of the additional most significant bit.

5. The semiconductor device as claimed in claim 4, wherein the count value of the additional counter is variable under a maximum value of the additional counter and the additional most significant bit is initialized such that the count value of the additional counter takes a half of the maximum value of the additional counter when the control circuit receives the calibration command.

* * * * *